United States Patent
Jeong et al.

(10) Patent No.: US 12,386,108 B2
(45) Date of Patent: Aug. 12, 2025

(54) LARGE-AREA SINGLE-CRYSTAL SILVER THIN-FILM STRUCTURE USING SINGLE-CRYSTAL COPPER THIN-FILM BUFFER LAYER AND MANUFACTURING METHOD THEREFOR

(71) Applicant: PUSAN NATIONAL UNIVERSITY INDUSTRY-UNIVERSITY COOPERATION FOUNDATION, Busan (KR)

(72) Inventors: Se Young Jeong, Busan (KR); Su Jae Kim, Busan (KR); You Sil Lee, Busan (KR)

(73) Assignee: PUSAN NATIONAL UNIVERSITY INDUSTRY-UNIVERSITY COOPERATION FOUNDATION, Busan (KR)

( * ) Notice: Subject to any disclaimer, the term of this patent is extended or adjusted under 35 U.S.C. 154(b) by 330 days.

(21) Appl. No.: 18/034,303

(22) PCT Filed: Oct. 15, 2021

(86) PCT No.: PCT/KR2021/014350
§ 371 (c)(1),
(2) Date: Apr. 27, 2023

(87) PCT Pub. No.: WO2022/097953
PCT Pub. Date: May 12, 2022

(65) Prior Publication Data
US 2024/0027661 A1    Jan. 25, 2024

(30) Foreign Application Priority Data
Nov. 5, 2020   (KR) .......................... 10-2020-0147198

(51) Int. Cl.
G02B 5/08      (2006.01)
C30B 23/08     (2006.01)
(Continued)

(52) U.S. Cl.
CPC ............ G02B 5/0808 (2013.01); C30B 23/08 (2013.01); C30B 29/02 (2013.01); C30B 29/20 (2013.01); C30B 29/68 (2013.01); G02B 1/02 (2013.01)

(58) Field of Classification Search
CPC ........ G02B 5/0875; C30B 29/68; C30B 29/02
See application file for complete search history.

(56) References Cited

FOREIGN PATENT DOCUMENTS

JP      2002-339084 A    11/2002
JP      2013173347 A  *   9/2013
(Continued)

OTHER PUBLICATIONS

International Search Report for PCT/KR2021/014350 mailed Jan. 21, 2022 from Korean Intellectual Property Office.

*Primary Examiner* — Alexander P Gross
(74) *Attorney, Agent, or Firm* — Paratus Law Group, PLLC

(57) ABSTRACT

There are provided a large-area single-crystal silver thin-film structure using a single-crystal copper thin-film buffer layer, and a method for manufacturing same. The large-area single-crystal silver thin-film structure includes a transparent substrate; a single-crystal copper thin-film buffer layer formed by deposition on the transparent substrate; and a single-crystal silver thin-film layer deposited on the single-crystal copper thin-film buffer layer and having a certain directionality.

10 Claims, 15 Drawing Sheets

(51) Int. Cl.
 *C30B 29/02* (2006.01)
 *C30B 29/20* (2006.01)
 *C30B 29/68* (2006.01)
 *G02B 1/02* (2006.01)

(56) References Cited

FOREIGN PATENT DOCUMENTS

| KR | 10-2006-0051658 A | 5/2006 | |
|---|---|---|---|
| KR | 10-2014-0069837 A | 6/2014 | |
| KR | 10-1802069 B1 | 11/2017 | |
| KR | 102095580 B1 * | 3/2020 | ....... H01L 21/02598 |
| KR | 10-2114658 B1 | 5/2020 | |

* cited by examiner

Front	Back

(A)

(B)

(C)

(D)

LARGE-AREA SINGLE-CRYSTAL SILVER THIN-FILM STRUCTURE USING SINGLE-CRYSTAL COPPER THIN-FILM BUFFER LAYER AND MANUFACTURING METHOD THEREFOR

CROSS-REFERENCE TO PRIOR APPLICATIONS

This application is a National Stage Patent Application of PCT International Patent Application No. PCT/KR2021/014350 (filed on Oct. 15, 2021) under 35 U.S.C. § 371, which claims priority to Korean Patent Application No. 10-2020-0147198 (filed on Nov. 5, 2020), which are all hereby incorporated by reference in their entirety.

BACKGROUND

The present invention relates to a large-area single-crystal silver thin film structure using a single-crystal copper thin-film buffer layer and a method for manufacturing the same, and more specifically, to a large-area single-crystal silver thin film structure using a single-crystal copper thin-film buffer layer and a method for manufacturing the same that are capable of manufacturing a silver thin film whose optical properties are improved using the single-crystal copper thin-film buffer layer grown using a single-crystal copper target and a single-crystal silver target.

As industries are highly developed, reflective films are increasingly used for various industrial devices such as cell phones, MP3, displays, lamp housings, lamp reflectors, and the like.

Generally, the reflective films may have flat shapes such as a sheet, a plate, and the like, molded bodies complicatedly machined by a press, etc., and further, they are made of metals having high reflectivity, such as silver, aluminum, copper, rhodium, platinum, and the like.

Such metals have excellent inherent reflection characteristics, but most of them are low in chemical stability. Further, they are difficult to be machined so as to provide a surface state with high illuminance through which excellent reflection characteristics are obtained, and they are heavy in weight and relatively high in price. Therefore, it is hard that only the metal materials are directly machined and used as the reflective films.

To solve such problems, a method for forming a metal on a substrate such as plastic by means of plating or vacuum deposition has been suggested. The method for applying plating with silver (Ag), chromium (Cr), and the like to the substrate obtains a metal-coated film having high surface gloss and reflectivity, but a defect rate is high in a manufacturing process. Further, costs for the plating are excessively needed, and air pollution and waste water are generated due to discharge of harmful substances during the plating.

Furthermore, the Patent literature 1 as will be suggested below describes an Ag-based reflective film and a method for manufacturing the same that are capable of allowing a material as a cap layer selected from a metal oxide of ITO, ZnO, IZO, and SnO2, an oxide of Si, Al, Ti and Ta, and a nitride of Si, Ai, Ti and Ta and having a thickness of 3 to 50 nm to be laid on a pure Ag film or an AgAu-based, AgAuSn-based, AgPd-based, AgPdCu-based alloy metal film, so that the Ag-based reflective film is formed of double layer films, thereby allowing reflectivity to have no deterioration even in a severe corrosion resistance test.

However, a silver thin film used as a mirror becomes disadvantageously low in reflectivity at some sections of wavelength ranges 400 to 2000 nm when compared with a mirror using gold, thereby causing limitations in use. Accordingly, two types of mirrors have to be mounted on various optical equipment, and if they are replaced, backgrounds may be changed, so that test reliability may be deteriorated. Accordingly, a method for solving such problems is definitely needed.

(Patent literature 1) Korean Patent Application Laid-open No. 10-2006-0051658 (Entitled: Ag-based reflective film and method for manufacturing the same)

SUMMARY

Accordingly, the present invention has been made in view of the above-mentioned problems occurring in the related art, and it is an object of the present invention to provide a large-area single-crystal silver thin film structure using a single-crystal copper thin-film buffer layer that is capable of being improved in optical properties and formed in a large area with a wafer scale.

It is another object of the present invention to provide a method for manufacturing the large-area single-crystal silver thin film structure as mentioned above.

The technical problems to be achieved through the present invention are not limited as mentioned above, and other technical problems not mentioned herein will be obviously understood by one of ordinary skill in the art through the following description.

To accomplish the above-mentioned objects, according to one aspect of the present invention, a single-crystal silver thin film structure may include: a transparent substrate 10; a single-crystal copper thin-film buffer layer 20 depositedly formed on top of the transparent substrate 10; and a single-crystal silver thin film layer 30 depositedly formed on the single-crystal copper thin-film buffer layer 20, wherein the single-crystal silver thin film structure is characterized by using the single-crystal copper thin-film buffer layer 20.

According to the single-crystal silver thin film structure of the present invention, the transparent substrate 10 may be a single-crystal sapphire substrate.

According to the single-crystal silver thin film structure of the present invention, the single-crystal copper thin-film buffer layer 20 and the single-crystal silver thin film layer 30 have the same crystal axis as each other, independently of each other.

According to the single-crystal silver thin film structure of the present invention, the single-crystal copper thin-film buffer layer 20 and the single-crystal silver thin film layer 30 may be grown by the same distance as each other along a, b, and c axes if the crystal axes are represented as the a axis, b axis, and c axis (in this case, the a, b, and c axes are perpendicular to one another).

The single-crystal silver thin film structure according to the present invention may have the reflectivity represented by the following Expression 1 greater than or equal to 98%.

$$\text{Reflectivity} = ((\text{Intensity of Reflected light wavelength})/(\text{Intensity of Incident light wavelength})) \times 100 \qquad [\text{Expression 1}]$$

(In the Expression 1, wavelengths of the reflected light and incident light are in the range of 400 to 2000 nm).

According to another aspect of the present invention, further, there is provided a method for manufacturing the single-crystal silver thin film structure as mentioned above.

To accomplish the above-mentioned objects, according to an embodiment of the present invention, a method for manufacturing a single-crystal silver thin film structure may include: the step (S100) of applying plasma to a single-crystal copper ingot target to deposit a single-crystal copper thin-film buffer layer 20 on a transparent substrate 10; and the step (S200) of applying plasma to a single-crystal silver ingot target to deposit a single-crystal silver thin film layer 30 on the single-crystal copper thin-film buffer layer 20, wherein the method for manufacturing the single-crystal silver thin film structure is characterized by using the single-crystal copper thin-film buffer layer 20.

According to the method for manufacturing the single-crystal silver thin film structure of the present invention, the step (S100) of forming the single-crystal copper thin-film buffer layer 20 may be carried out by depositing the single-crystal copper thin-film buffer layer 20 on the transparent substrate 10 by means of sputtering.

According to the method for manufacturing the single-crystal silver thin film structure of the present invention, the sputtering may be carried out at power of 20 to 40 W and at temperature of 150 to 250° C.

According to the method for manufacturing the single-crystal silver thin film structure of the present invention, the step (S200) of forming the single-crystal silver thin film layer may be carried out by depositing the single-crystal silver thin film layer 30 on the single-crystal copper thin-film buffer layer 20 by means of sputtering.

According to the method for manufacturing the single-crystal silver thin film structure of the present invention, the sputtering may be carried out at power of 5 to 20 W and at temperature of 100 to 250° C.

According to the present invention, the single-crystal silver thin film structure according to the present invention can provide the single-crystal silver thin film that is improved in optical properties by using the single-crystal copper thin film with zero defects as the buffer layer, so that it can replace various silver and gold mirrors.

The method for manufacturing the single-crystal silver thin film structure according to the present invention includes the step (S100) of forming the single-crystal copper thin-film buffer layer and the step (S200) of forming the single-crystal silver thin film layer, so that the single-crystal silver thin film is grown to the large area with the wafer scale, thereby improving the optical properties and the adhesion force with the substrate.

According to the present invention, the single-crystal copper thin-film buffer layer 20 and the single-crystal silver thin film layer 30 have the same directionality as each other, so that hole mobility increases to provide excellent electrical and optical properties.

According to the present invention, the single-crystal silver thin film layer 30 laid on the single-crystal copper thin-film buffer layer 20 is grown to be high-quality single-crystal and has excellent crystallizability.

DETAILED DESCRIPTION

Hereinafter, an explanation of the present invention will be given in detail. Before the present invention is disclosed and described, it is to be understood that the disclosed embodiments are merely exemplary of the invention, which can be embodied in various forms. All terms used herein, including technical or scientific terms, unless otherwise defined, have the same meanings which are typically understood by those having ordinary skill in the art. If it is determined that the detailed explanation on the well known technology related to the present invention makes the scope of the present invention not clear, the explanation will be avoided for the brevity of the description.

The silver thin film used as the conventional mirror becomes disadvantageously low in reflectivity at some sections of wavelength ranges 400 to 2000 nm when compared with the mirror using gold, thereby causing limitations in use. The present inventors have made various studies to solve the above problems and as a result, they have found that if a single-crystal copper thin-film buffer layer with zero defects manufactured using a single-crystal copper target is deposited and a single-crystal silver thin film layer is deposited on the copper thin-film buffer layer, a large-area single-crystal silver thin film structure is formed in a large area, while improving its optical properties. Accordingly, the present invention relates to the large-area single-crystal silver thin film structure and the method for manufacturing the same that are characterized by using the single-crystal copper thin-film buffer layer.

Figure 1:
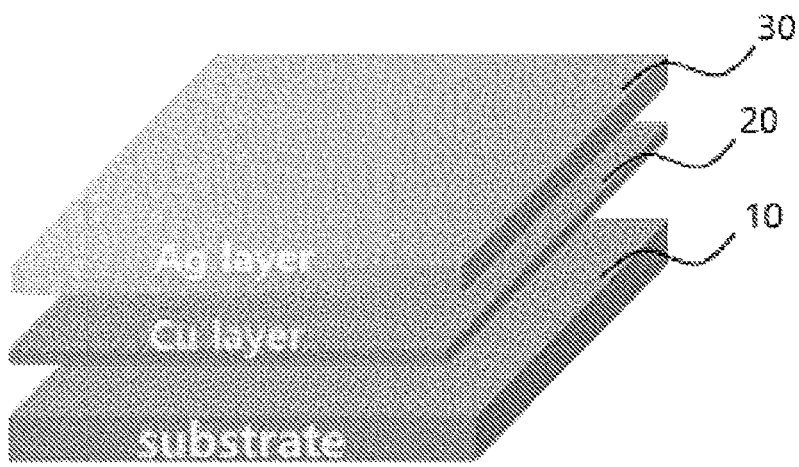
FIG. 1 is a schematic view showing a single-crystal silver thin film structure according to an embodiment of the present invention.
Figure 2:
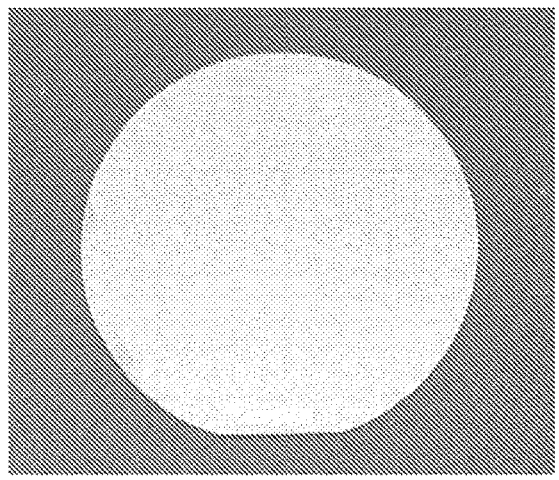
FIG. 2 is a photograph showing one real single-crystal silver thin film structure according to the embodiment of the present invention.
Figure 2:
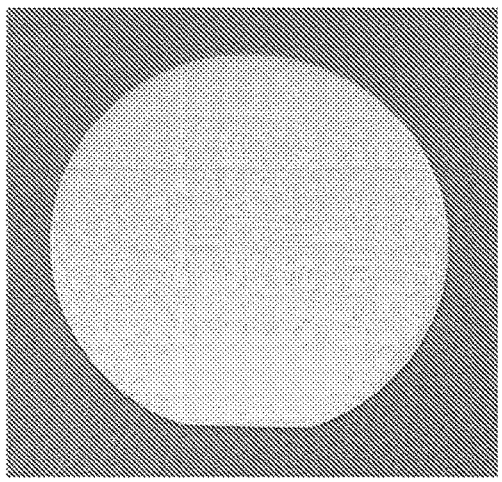

FIG. 1 is a schematic view showing a single-crystal silver thin film structure according to an embodiment of the present invention, and FIG. 2 is a photograph showing one real single-crystal silver thin film structure according to the embodiment of the present invention.

As shown in FIGS. 1 and 2, a single-crystal silver thin film structure according to an embodiment of the present invention includes a transparent substrate 10, a single-crystal copper thin-film buffer layer 20, and a single-crystal silver thin film layer 30. The single-crystal copper thin-film buffer layer 20 and the single-crystal silver thin film layer 30 are laid sequentially on top of the transparent substrate 10.

In specific, the transparent substrate 10 is the substrate that is transparent and stable structurally and chemically, such as, a sapphire substrate, a silicone substrate, and the like, but according to the present invention, it is desirable that the transparent substrate 10 be the sapphire substrate so as to form the single-crystal copper thin-film buffer layer 20 with zero defect.

The single-crystal copper thin-film buffer layer 20 is deposited on the transparent substrate 10. If the single-crystal sapphire substrate is used as the transparent substrate 10, the single-crystal copper thin-film buffer layer 20 is grown in a given direction through the interaction with the sapphire substrate. The single-crystal copper thin-film buffer layer 20 is grown by means of radio frequency (RF) sputtering and interacts with the transparent substrate 10 to allow the silver thin film as will be deposited later to become single-crystal. Upon the RF sputtering, it is desirable that a single-crystal copper ingot grown through the Czochralski method is machinedly used as a target.

The single-crystal silver thin film layer 30 is deposited on the single-crystal copper thin-film buffer layer 20. If the single-crystal silver thin film layer 30 is deposited on the single-crystal copper thin-film buffer layer 20, it has a single-crystal structure in a given direction. As the single-crystal silver thin film layer 30 is formed on top of the single-crystal copper thin-film buffer layer 20, it has strong adhesion with the substrate 10 and is thus grown in a large area, thereby improving the optical properties thereof.

Further, the single-crystal silver thin film structure according to the embodiment of the present invention is desirably manufactured to the shape of the large area such as a 2-inch wafer scale, a 4-inch wafer scale, and the like. The single-crystal silver thin film layer 30 is formed by machining a single-crystal silver ingot grown through the Czochralski method as a target, and then, the single-crystal silver thin film layer 30 is deposited on top of the single-crystal copper thin-film buffer layer 20 by means of sputtering. In this case, the sputtering is desirably RF sputtering.

Furthermore, the single-crystal silver thin film structure according to the embodiment of the present invention is configured to allow the single-crystal copper thin-film buffer layer 20 and the single-crystal silver thin film layer 30 to have the same crystal axis as each other, independently of each other. Accordingly, the single-crystal silver thin film structure according to the present invention is structurally stable so that there are no inter-layer defects.

In more specific, the single-crystal silver thin film structure according to the embodiment of the present invention is configured to allow the single-crystal copper thin-film buffer layer 20 and the single-crystal silver thin film layer 30 to be grown by the same distance as each other along a, b, and c axes if the crystal axes are represented as the a axis, b axis, and c axis (in this case, the a, b, and c axes are perpendicular to one another). For example, the single-crystal copper thin-film buffer layer 20 and the single-crystal silver thin film layer 30 are represented with (111), (222), (333), and the like as Miller indices, which means that the single-crystal copper thin-film buffer layer 20 and the single-crystal silver thin film layer 30 are grown by the same distance as each other along the a, b, and c axes.

Figure 3:
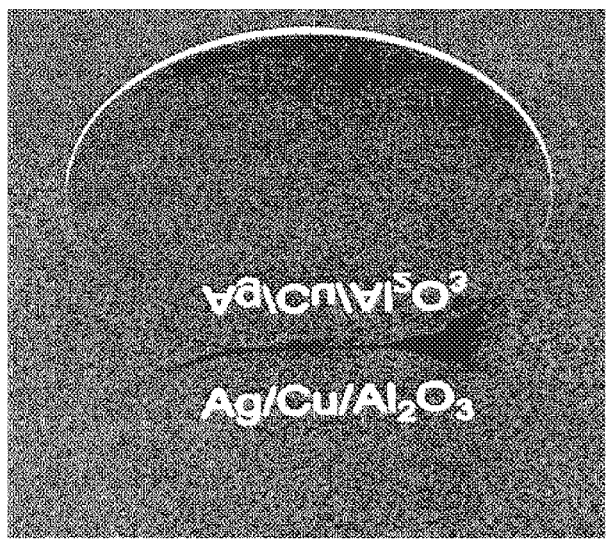
FIG. 3 is a photograph showing another real single-crystal silver thin film structure according to the embodiment of the present invention.
Figure 3:
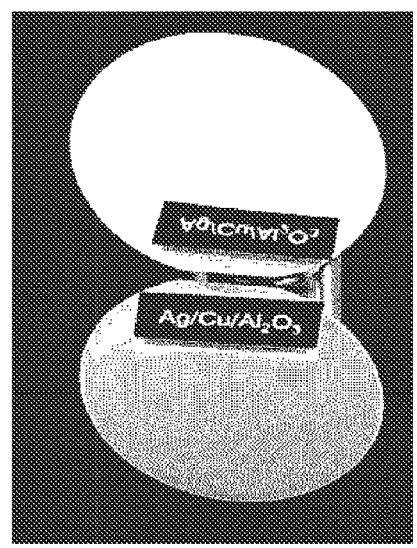

FIG. 3 is a photograph showing another real single-crystal silver thin film structure according to the embodiment of the present invention. As shown in FIG. 3, the single-crystal silver thin film structure according to the present invention has excellent reflection characteristics and a large area with a wafer scale.

Figure 4:
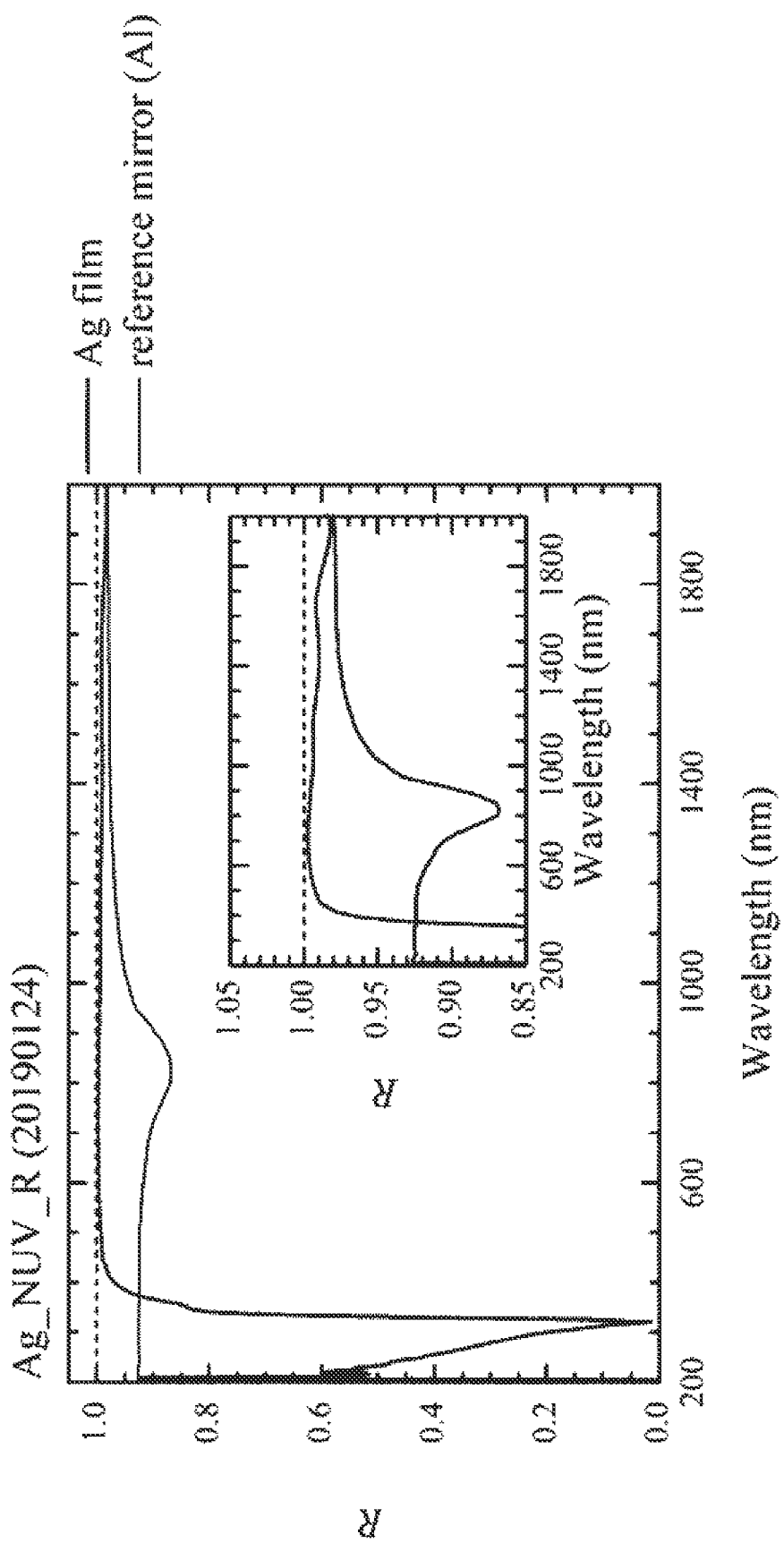
FIG. 4 is a graph showing reflectivity of the single-crystal silver thin film structure according to the embodiment of the present invention.

FIG. 4 is a graph showing reflectivity of the single-crystal silver thin film structure according to the embodiment of the present invention. As shown in FIG. 4, it is checked that the reflectivity of the silver thin film structure, which is represented by the following Expression 1, is greater than or equal to 98% in the wavelength range of 400 to 2000 nm, and it is observed that the reflectivity of the silver thin film structure is greater than or equal to 99% in a given portion of visible light range.

$$\text{Reflectivity} = ((\text{Intensity of Reflected light wavelength})/(\text{Intensity of Incident light wavelength})) \times 100 \quad \text{[Expression 1]}$$

(In the Expression 1, wavelengths of the reflected light and incident light are in the range of 400 to 2000 nm).

The single-crystal silver thin film structure according to the embodiment of the present invention has been explained above, and next, a method for manufacturing a single-crystal silver thin film structure using a single-crystal copper thin-film buffer layer according to another embodiment of the present invention will be explained in detail.

Figure 5:
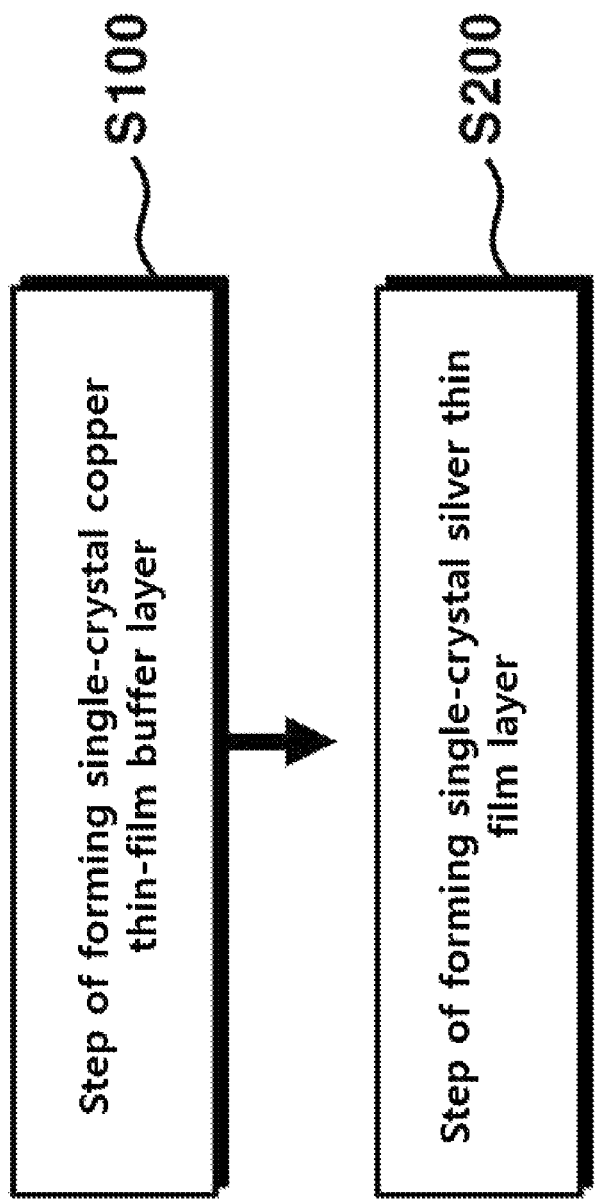
FIG. 5 is a flowchart showing a method for manufacturing a large-area single-crystal silver thin film structure using a single-crystal copper thin-film buffer layer according to another embodiment of the present invention.

FIG. 5 is a flowchart showing a method for manufacturing a large-area single-crystal silver thin film structure using a single-crystal copper thin-film buffer layer according to another embodiment of the present invention. As shown in FIG. 5, the method for manufacturing a single-crystal silver thin film structure according to the present invention includes the step (S100) of forming a single-crystal copper thin-film buffer layer and the step (S200) of forming a single-crystal silver thin film layer.

In specific, the step (S100) of forming a single-crystal copper thin-film buffer layer is carried out by applying plasma to a single-crystal copper ingot target to deposit a single-crystal copper thin-film buffer layer 20 on a transparent substrate 10.

A method for applying the plasma at the step (S100) of forming a single-crystal copper thin-film buffer layer is used with a typical method in the art, and for example, inert gas such as argon is introduced into a vacuum chamber to generate plasma through the application of a voltage.

At the step (S100) of forming a single-crystal copper thin-film buffer layer in the method according to the present invention, the single-crystal copper thin-film buffer layer 20 is deposited on the transparent substrate 10 by means of sputtering. At the step (S100) of forming a single-crystal copper thin-film buffer layer, desirably, the single-crystal copper target is used, and the sputtering is RF sputtering.

In more specific, the sputtering for the single-crystal copper target is desirably carried out at power of 20 to 40 W and at temperature of 150 to 250° C. If a sputtering temperature is higher or lower than the above-mentioned range, an adhesion force between the single-crystal silver thin film layer 30 and the transparent substrate 10 may be weakened at the step (S200) of forming a single-crystal silver thin film layer as will be discussed later, and as grain boundary and potential are formed, further, crystallizability may be lowered. Therefore, it is desirable that RF sputtering be carried out within the above-mentioned temperature range. In this case, a single-crystal copper ingot grown through the Czochralski method is machined and used as the copper ingot target.

Next, the step (S200) of forming a single-crystal silver thin film layer is carried out by applying plasma to a single-crystal silver ingot target to deposit a single-crystal silver thin film layer 30 on the single-crystal copper thin-film buffer layer 20.

Desirably, the single-crystal silver ingot grown through the Czochralski method is machined and used as the silver ingot target.

At the step (S200) of forming a single-crystal silver thin film layer in the method according to the present invention, the single-crystal silver thin film layer 30 is deposited on the single-crystal copper thin-film buffer layer 20 by means of sputtering, and desirably, the sputtering is RF sputtering.

In more specific, the sputtering is desirably carried out at power of 5 to 20 W and at temperature of 100 to 250° C. If a sputtering temperature is higher or lower than the above-mentioned range, grain boundary and potential are formed so that crystallizability may be lowered. Therefore, it is desirable that RF sputtering be carried out within the above-mentioned temperature range.

Accordingly, the method for manufacturing the single-crystal silver thin film structure according to the present invention includes the step (S100) of forming the single-crystal copper thin-film buffer layer and the step (S200) of forming the single-crystal silver thin film layer, so that it is possible that the single-crystal silver thin film is grown to a large area with a wafer scale, thereby forming the silver thin film structure whose optical properties and adhesion with the substrate are improved.

Hereinafter, the properties of the silver thin film structure manufactured by the method of the present invention will be explained in detail with reference to the attached drawings. In this case, the explanation is given on the condition where the transparent substrate 10 is a sapphire substrate.

Figure 6:
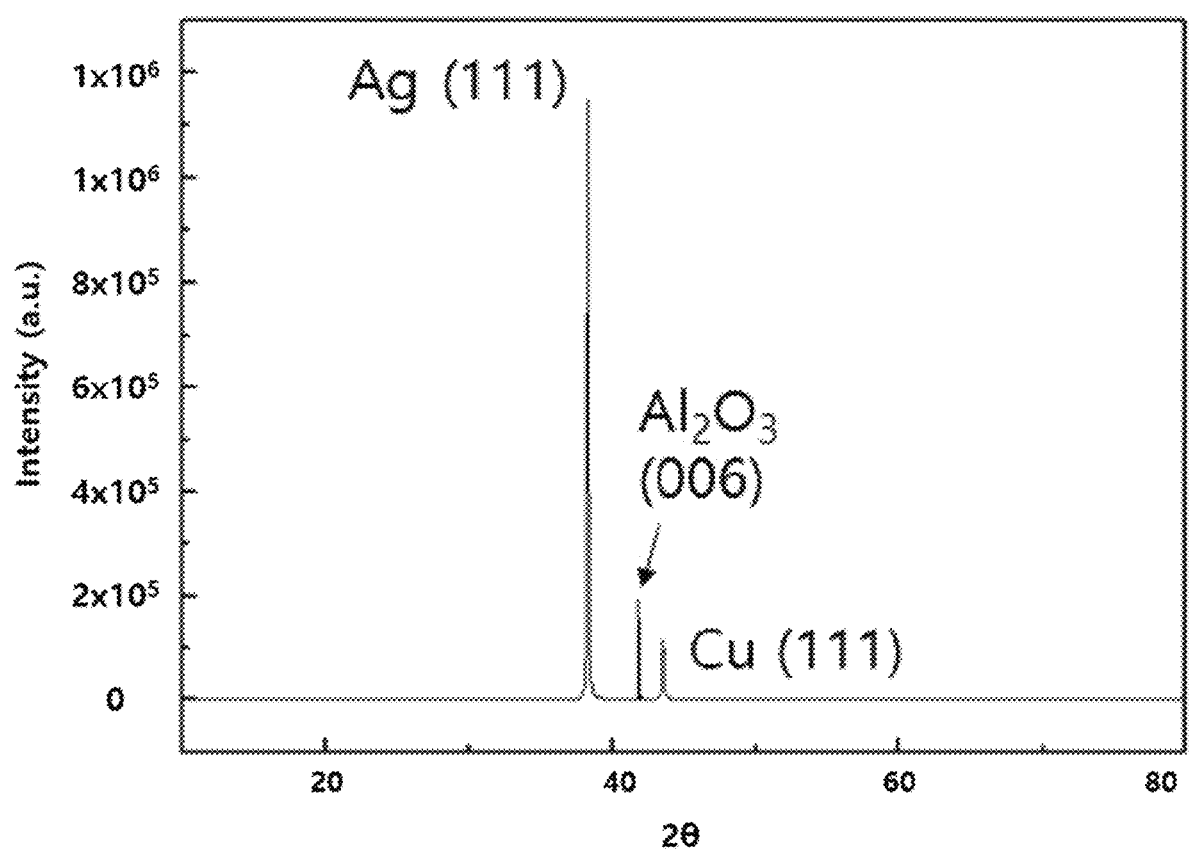
FIG. 6 is a graph showing an X-ray diffraction pattern of the single-crystal silver thin film structure according to the embodiment of the present invention.

FIG. 6 is a graph showing an X-ray diffraction pattern of the single-crystal silver thin film structure according to the embodiment of the present invention. In specific, as shown in FIG. 6, an XRD peak of the transparent sapphire substrate 10 is represented as "$Al_2O_3$", that of the single-crystal copper thin-film buffer layer 20 is as "Cu", and that of the single-crystal silver thin film layer 30 is as "Ag". Further, the parentheses represent their crystallographic directions as Miller indices. As shown in FIG. 6, it can be appreciated that the (111) direction peak of the single-crystal silver thin film layer 30 deposited is greater in intensity than the single-crystal peak of the transparent substrate 10 and the (111) direction peak of the single-crystal copper thin-film buffer layer 20 exists. Further, the single-crystal copper thin-film buffer layer 20 and the single-crystal silver thin film layer 30 have the same directionality as each other, so that hole mobility increases to provide excellent electrical and optical properties.

Figure 7:
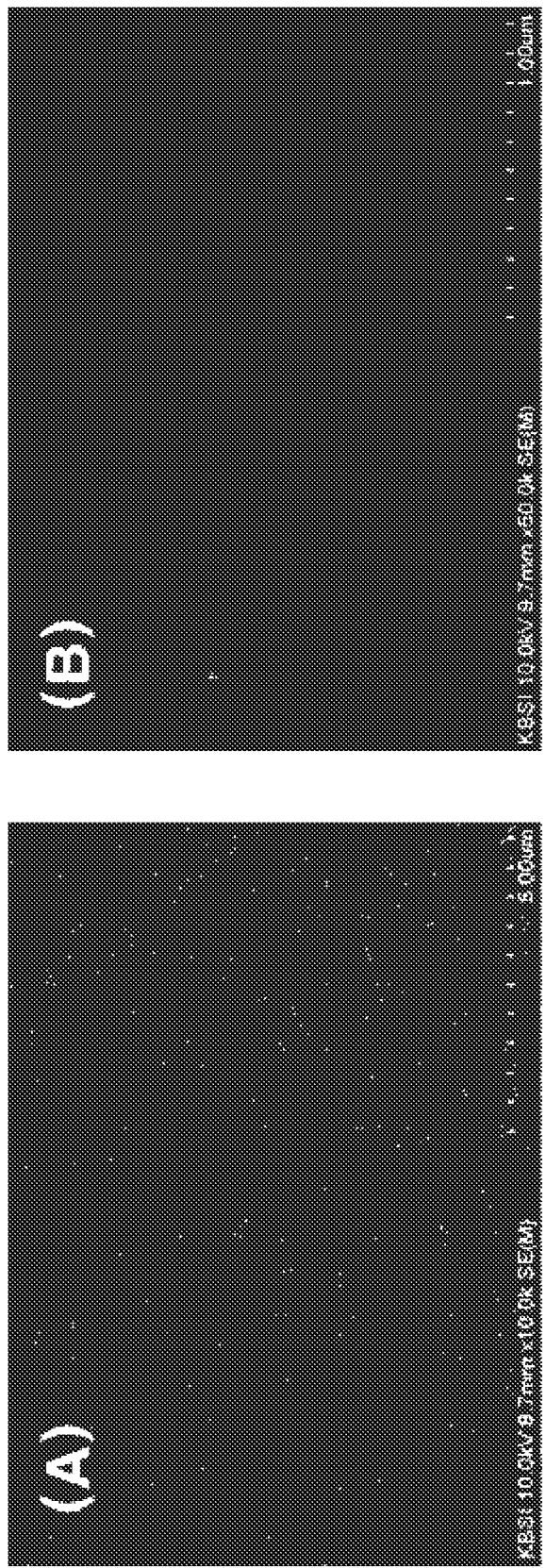
FIG. 7 shows SEM images of a single-crystal copper thin-film buffer layer 20 deposited on a transparent substrate 10 in the single-crystal silver thin film structure according to the embodiment of the present invention.

FIG. 7 shows SEM images of the single-crystal copper thin-film buffer layer 20 deposited on the transparent substrate 10 in the single-crystal silver thin film structure according to the embodiment of the present invention. As shown in FIG. 7, (A) shows an SEM image at 10,000× magnification, and (B) shows an SEM image at 50,000× magnification. As appreciated from FIG. 7, the surface of the single-crystal copper thin-film buffer layer 20 does not have any defects and is thus clean.

Figure 8:
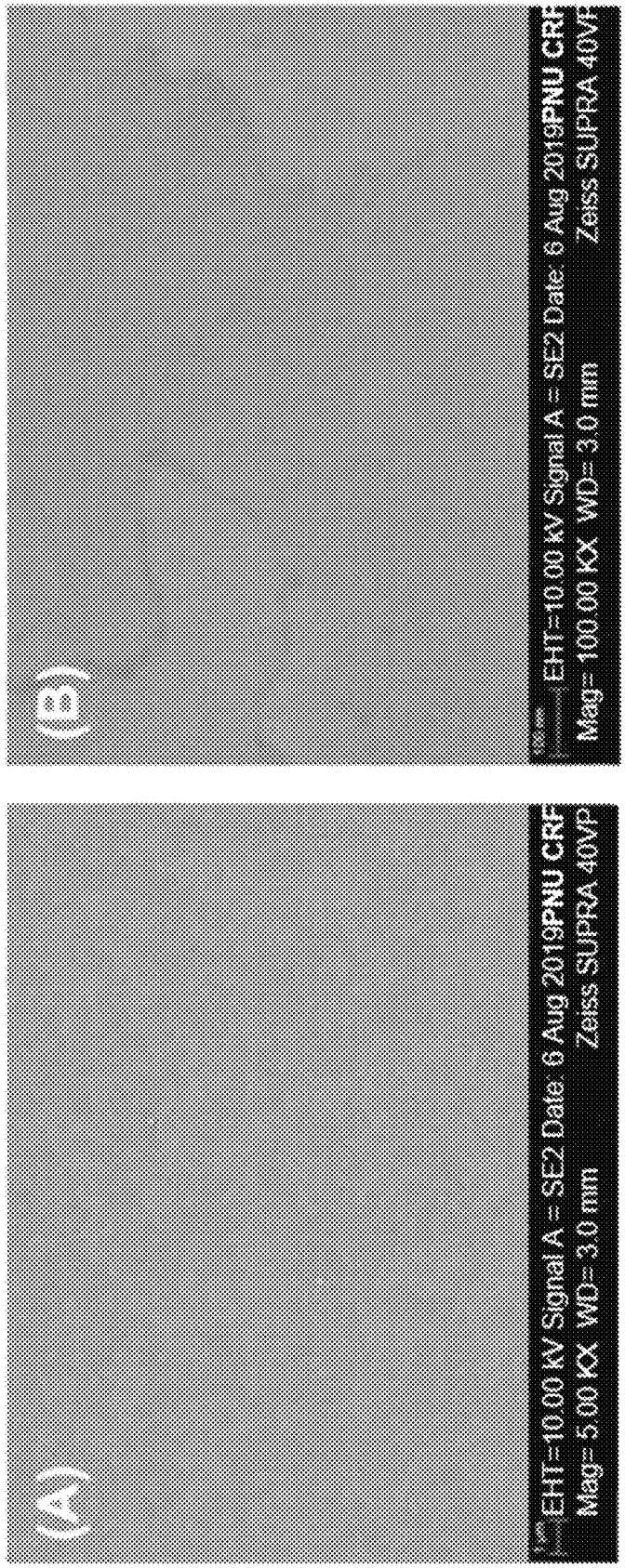
FIG. 8 shows SEM images of a single-crystal silver thin film layer 30 deposited on the single-crystal copper thin-film buffer layer 20 in the single-crystal silver thin film structure according to the embodiment of the present invention.

FIG. 8 shows SEM images of the single-crystal silver thin film layer 30 deposited on the single-crystal copper thin-film buffer layer 20 in the single-crystal silver thin film structure according to the embodiment of the present invention. As shown in FIG. 8, (A) shows an SEM image at 5,000× magnification, and (B) shows an SEM image at 100,000× magnification. As appreciated from FIG. 8, the single-crystal silver thin film layer 30 is rougher than the single-crystal copper thin-film buffer layer 20.

Figure 9:
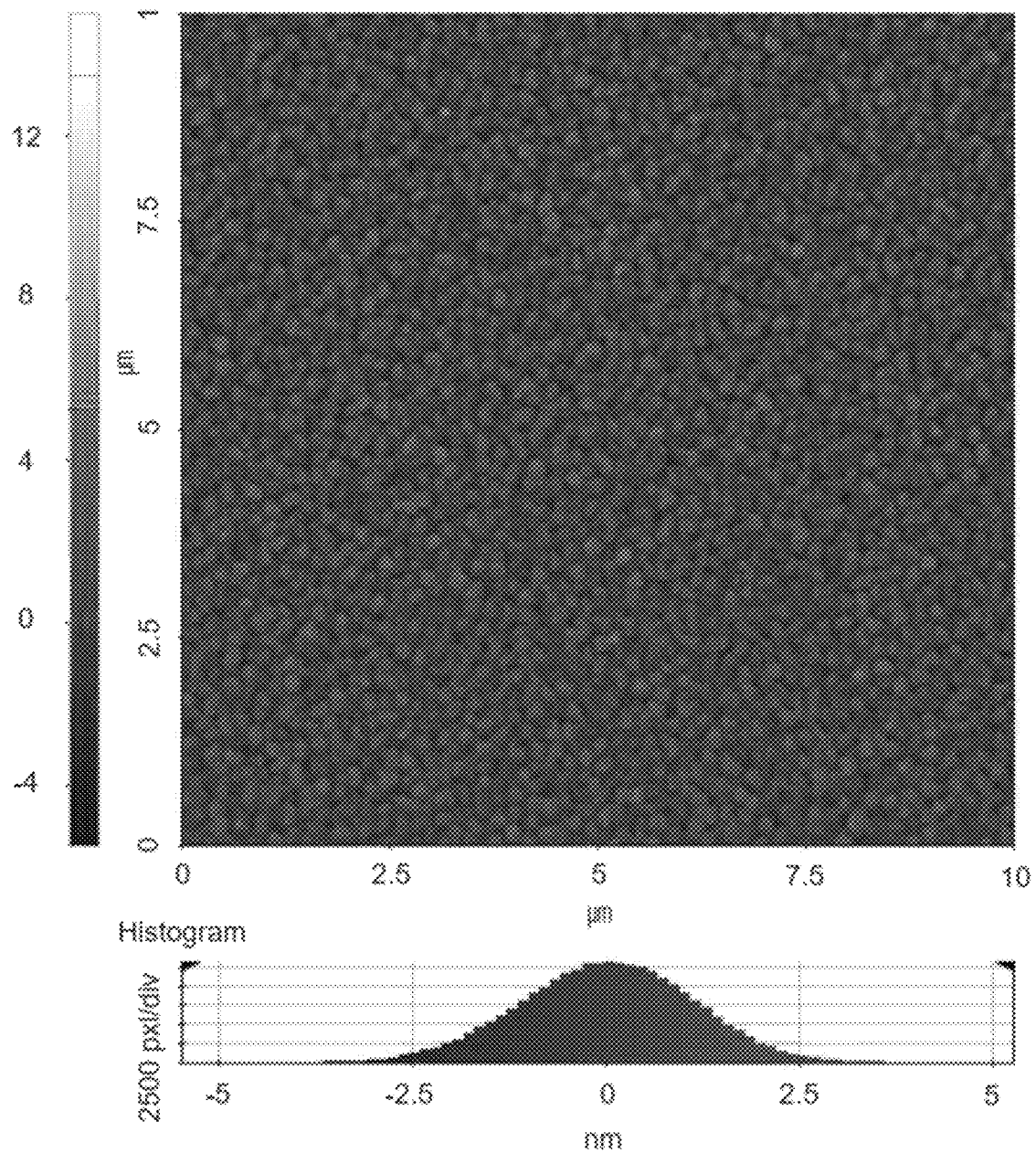
FIG. 9 shows an AFM image of the single-crystal silver thin film layer 30 in the single-crystal silver thin film structure according to the embodiment of the present invention.

FIG. 9 shows an AFM image of the single-crystal silver thin film layer 30 in the single-crystal silver thin film structure according to the embodiment of the present invention. As appreciated from FIG. 9, root mean square (RMS) is about 1.103 nm in the surface distribution observed in −2.5 to 2.5 nm through an atomic force microscope (AFM), which shows extremely small roughness properties.

Figure 10:
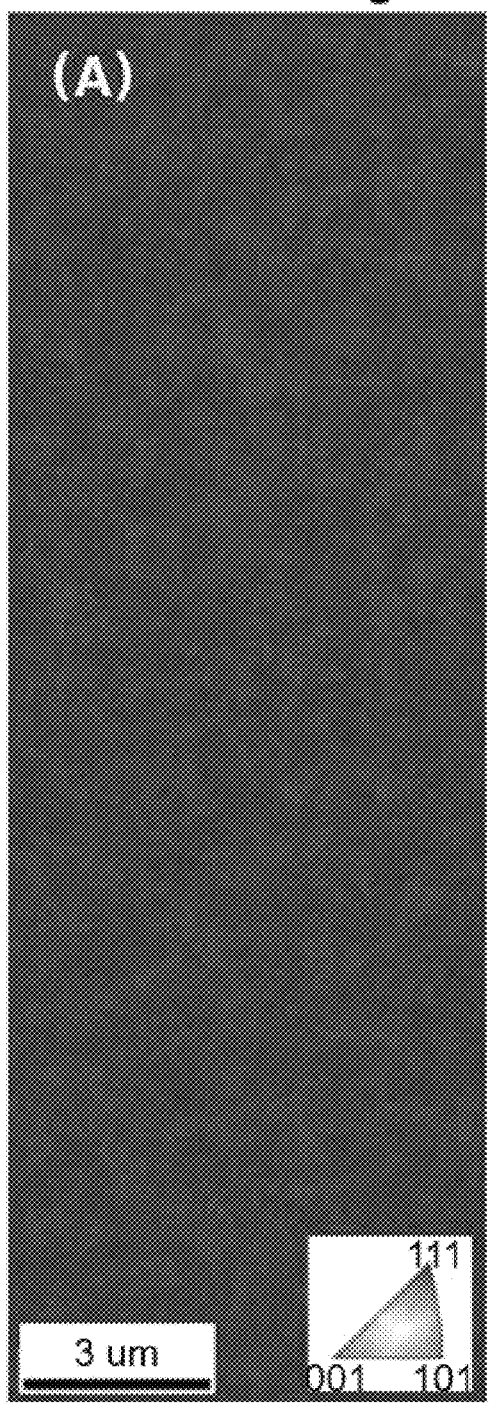
FIG. 10 shows EBSD images of the single-crystal copper thin-film buffer layer 20 and the single-crystal silver thin film layer 30 in the single-crystal silver thin film structure according to the embodiment of the present invention.
Figure 10:
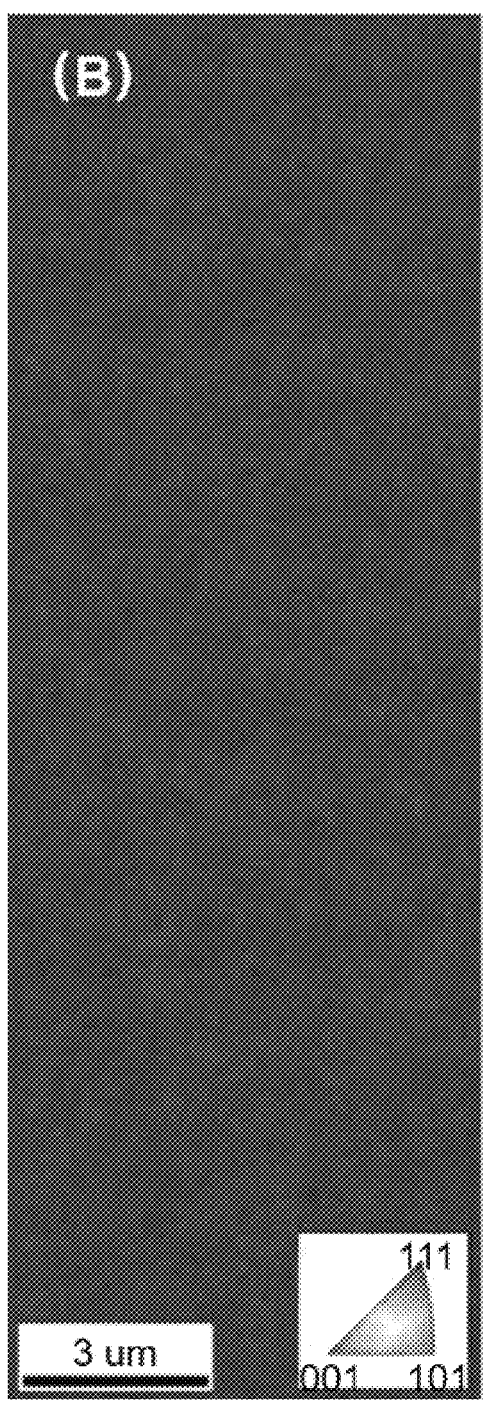

FIG. 10 shows EBSD images of the single-crystal copper thin-film buffer layer 20 and the single-crystal silver thin film layer 30 in the single-crystal silver thin film structure according to the embodiment of the present invention. As shown in FIG. 10, (A) shows an EBSD image of the single-crystal copper thin-film buffer layer 20, and (B) shows an EBSD image of the single-crystal silver thin film layer 30. As appreciated from FIG. 10, the single-crystal copper thin-film buffer layer 20 and the single-crystal silver thin film layer 30 have the same color as each other so that they do not have any grain boundary oriented in different directions from each other. In FIG. 10, a blue color represents the (111) direction.

Figure 11:
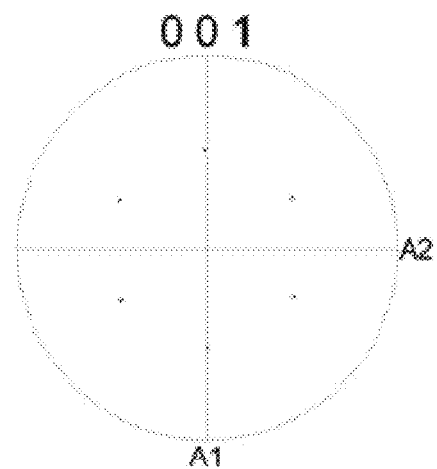
FIG. 11 shows a pole figure (PF) and an inverse pole figure (IPF) of the single-crystal silver thin film structure according to the embodiment of the present invention.
Figure 11:
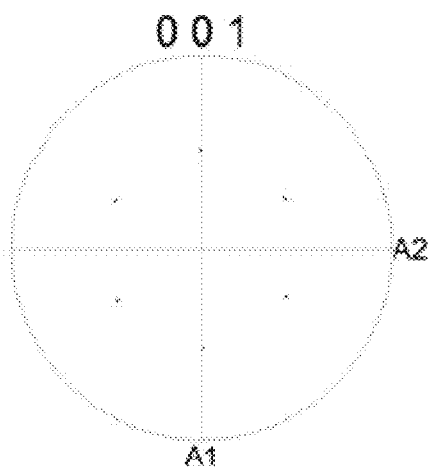
Figure 11:
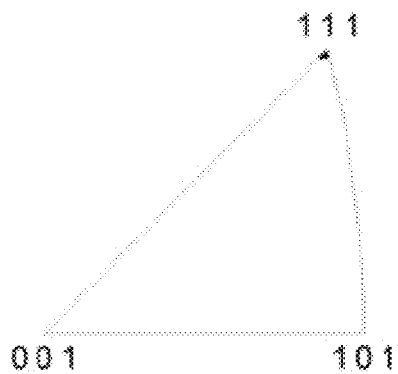
Figure 11:
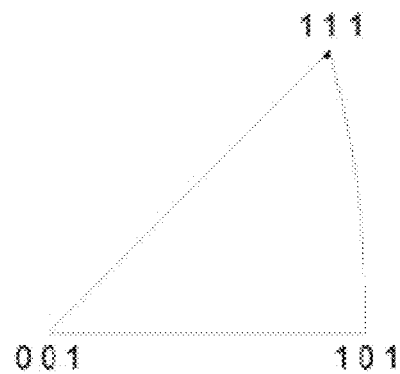

FIG. 11 shows a pole figure (PF) and an inverse pole figure (IPF) of the single-crystal silver thin film structure according to the embodiment of the present invention. As shown in FIG. 11, (A) shows a PF of the single-crystal silver thin film layer 30, (B) shows a PF of the single-crystal copper thin-film buffer layer 20, and (C) shows an IPF of the single-crystal silver thin film layer 30, and (D) shows an IPF of the single-crystal copper thin-film buffer layer 20. As appreciated from FIG. 11, the single-crystal silver thin film layer 30 deposited on the single-crystal copper thin-film buffer layer 20 is grown to be high-quality single-crystal and has excellent crystallizability.

Figure 12:
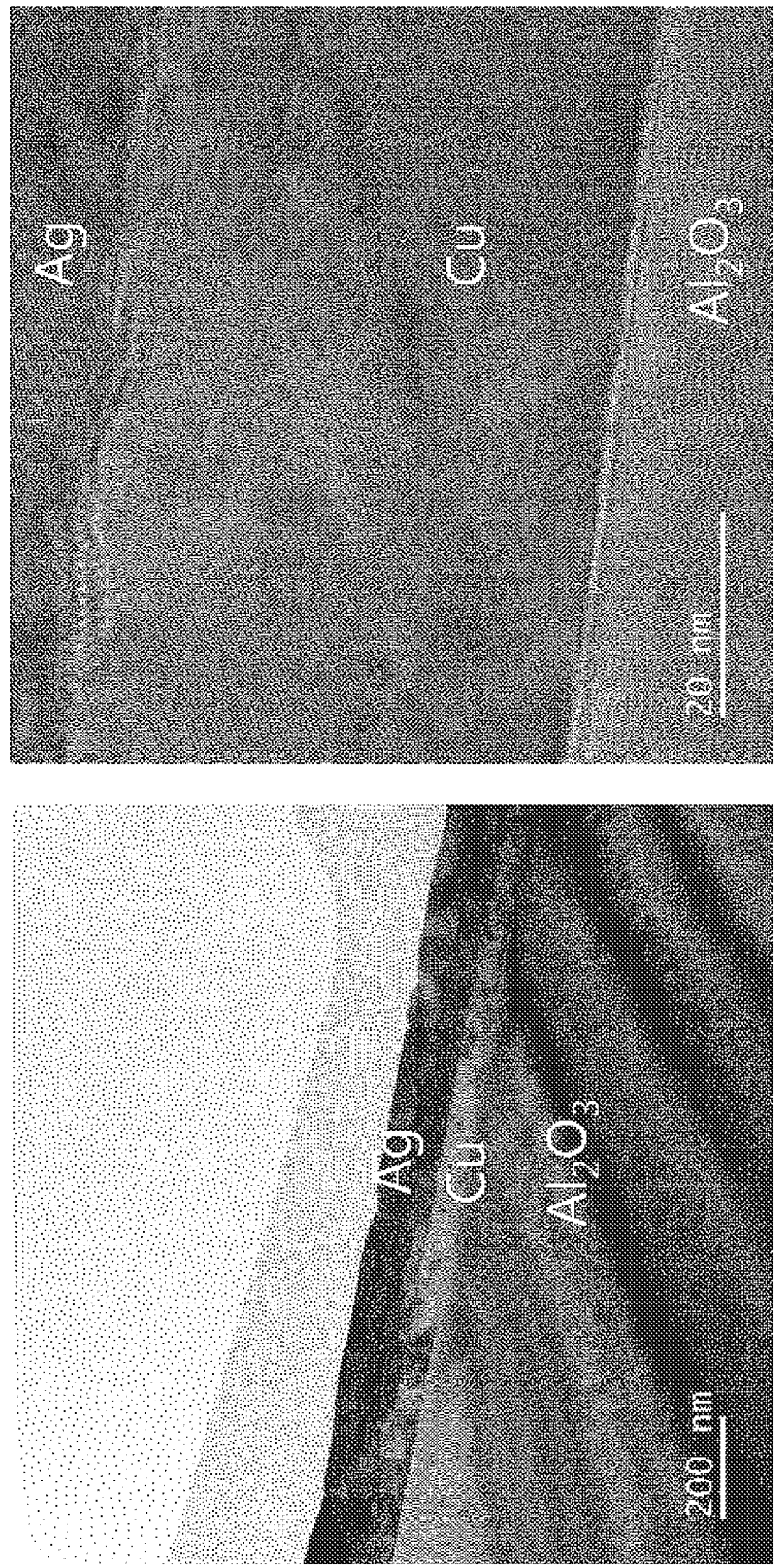
FIG. 12 shows TEM section images of the surface of the single-crystal silver thin film structure according to the embodiment of the present invention.

FIG. 12 shows TEM section images of the surface of the single-crystal silver thin film structure according to the embodiment of the present invention. In FIG. 12, $Al_2O_3$ is the sapphire transparent substrate 10, Cu is the single-crystal copper thin-film buffer layer 20, and Ag is the single-crystal silver thin film layer 30. As appreciated from FIG. 12, the single-crystal copper thin-film buffer layer 20 and the single-crystal silver thin film layer 30 are laid sequentially on the transparent substrate 10 and deposited as the layers with no defects (cracks). Further, the single-crystal copper thin-film buffer layer 20 has a thickness in the range of about 50 to 70 nm, and the single-crystal silver thin film layer 30 has a thickness in the range of about 100 to 150 nm.

Figure 13:
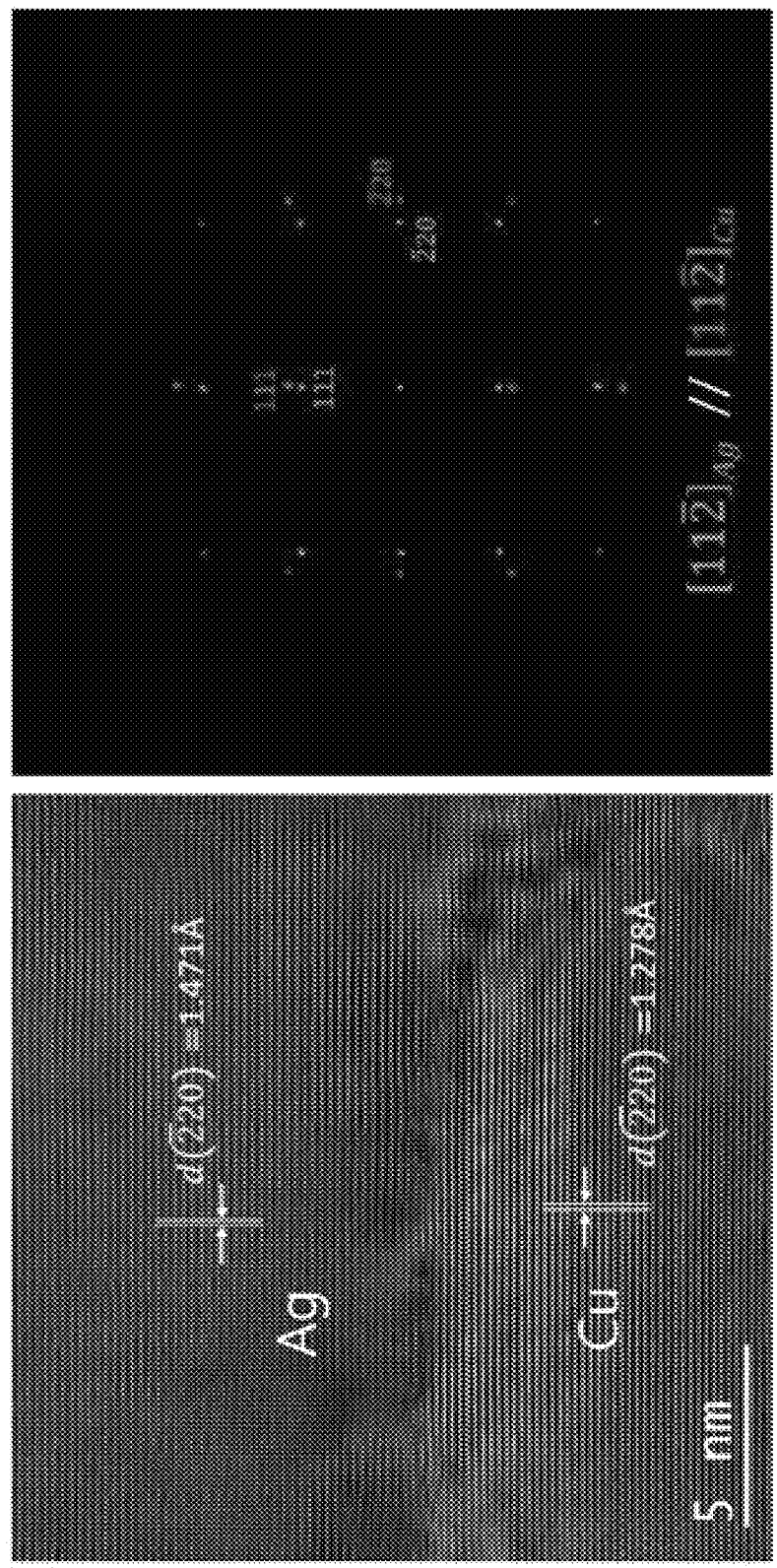
FIG. 13 shows TEM section and FFT images of the single-crystal silver thin film structure according to the embodiment of the present invention.

FIG. 13 shows TEM section and FFT images of the single-crystal silver thin film structure according to the embodiment of the present invention. As appreciated from FIG. 13, a vertical surface with respect to the section of the sample is (11-2), and the copper thin-film buffer layer 20 and the single-crystal silver thin film layer 30 are grown in the same direction as each other, so that they have a single-crystal phase.

Figure 14:
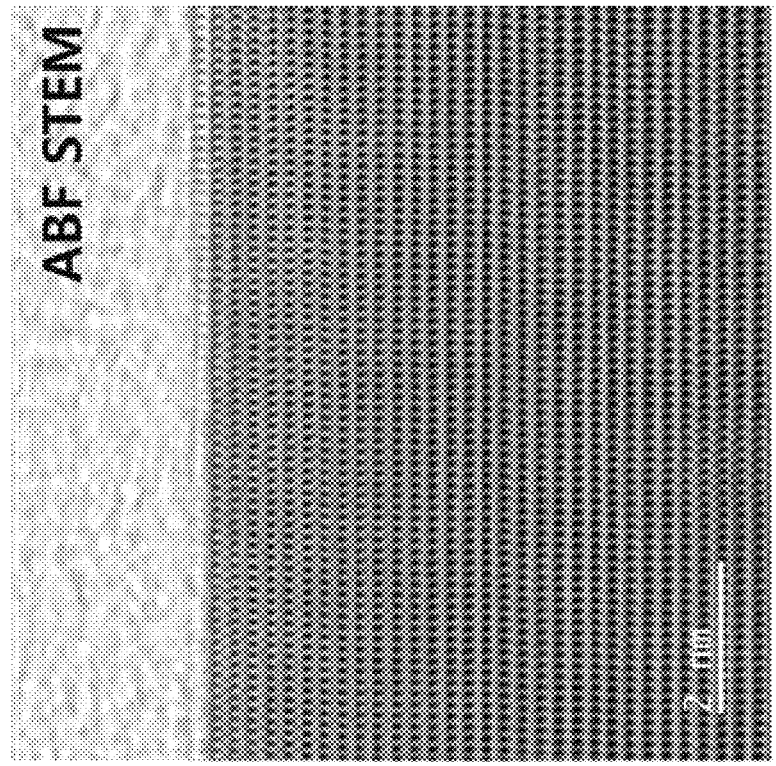
FIG. 14 shows TEM surface images of the single-crystal silver thin film structure according to the embodiment of the present invention.
Figure 14:
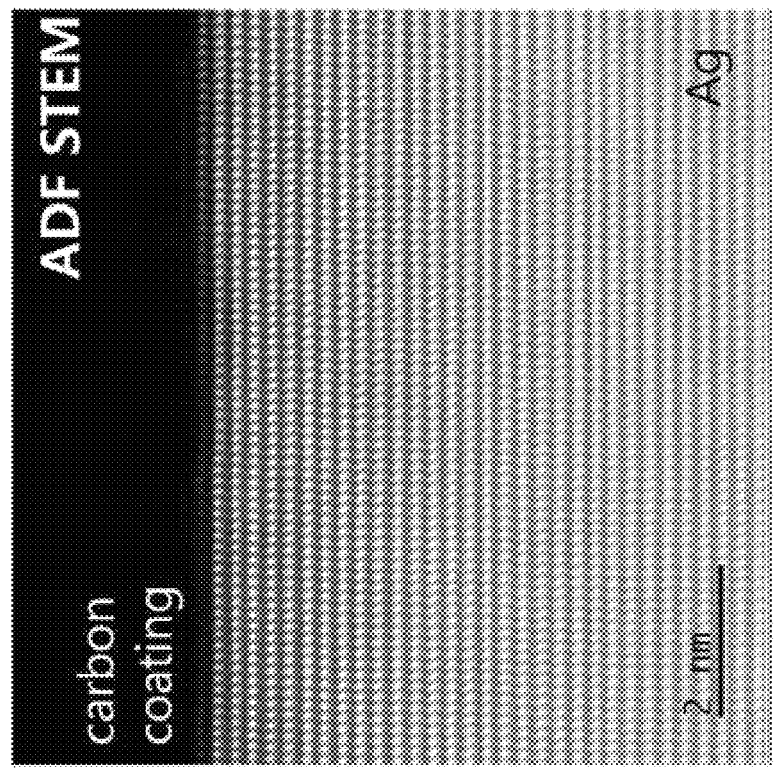

FIG. 14 shows TEM surface images of the single-crystal silver thin film structure according to the embodiment of the present invention. As appreciated from FIG. 14, the surface of the single-crystal silver thin film structure according to the present invention is well grown to atom levels. The growth to the atom levels reduces surface roughness so that advantageously, diffused reflection on the surface decreases and reflectivity is maximized. In this case, the atom levels represent the range of 0.1 to 1 nm.

Figure 15:
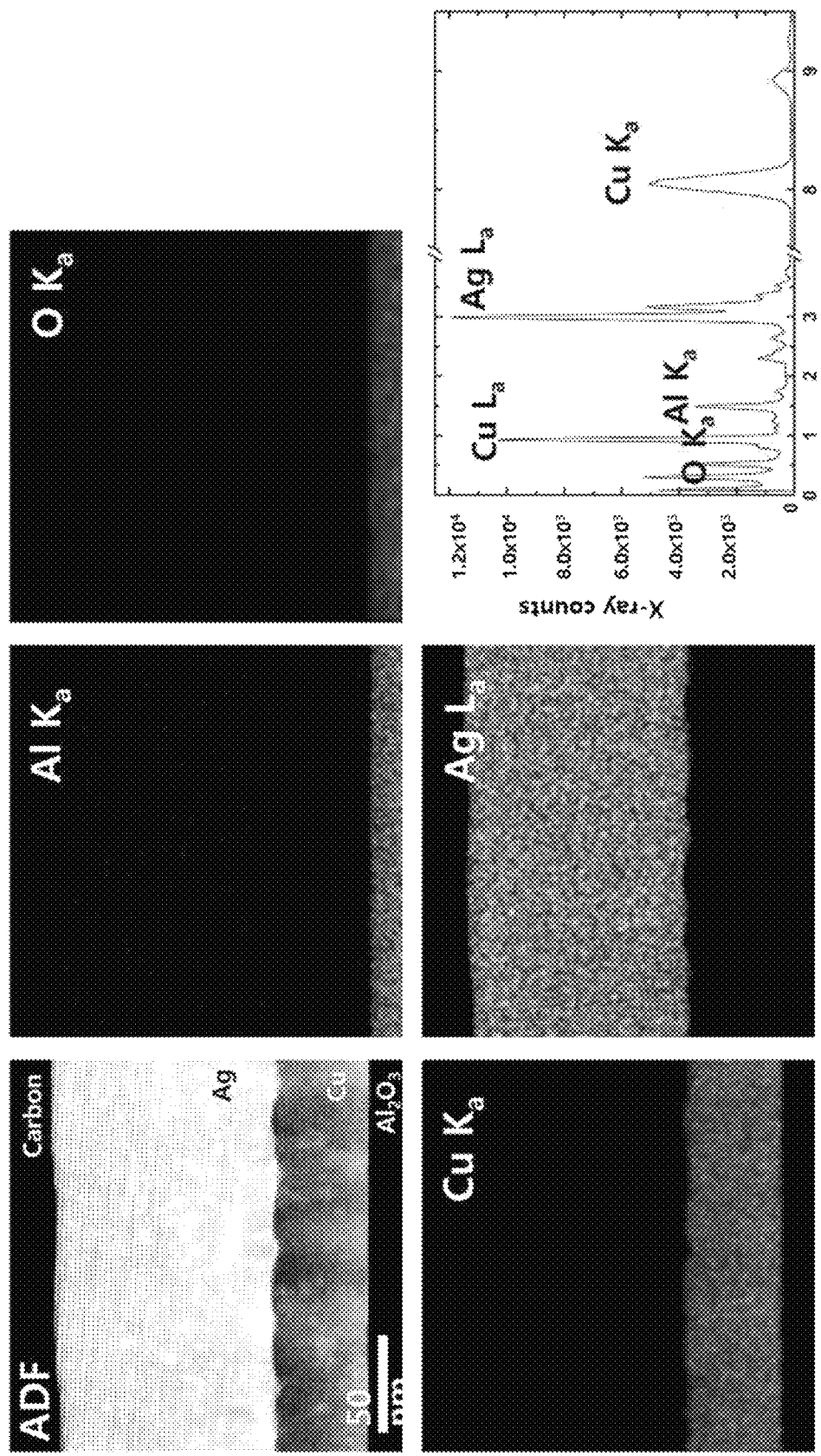
FIG. 15 shows TEM-EDX mapping images of the single-crystal silver thin film structure according to the embodiment of the present invention.

FIG. 15 shows TEM-EDX mapping images of the single-crystal silver thin film structure according to the embodiment of the present invention. As shown in FIG. 15, it can be appreciated that the single-crystal copper thin-film buffer layer 20 and the single-crystal silver thin film layer 30 are formed as the layers having no oxygen.

Figure 16:
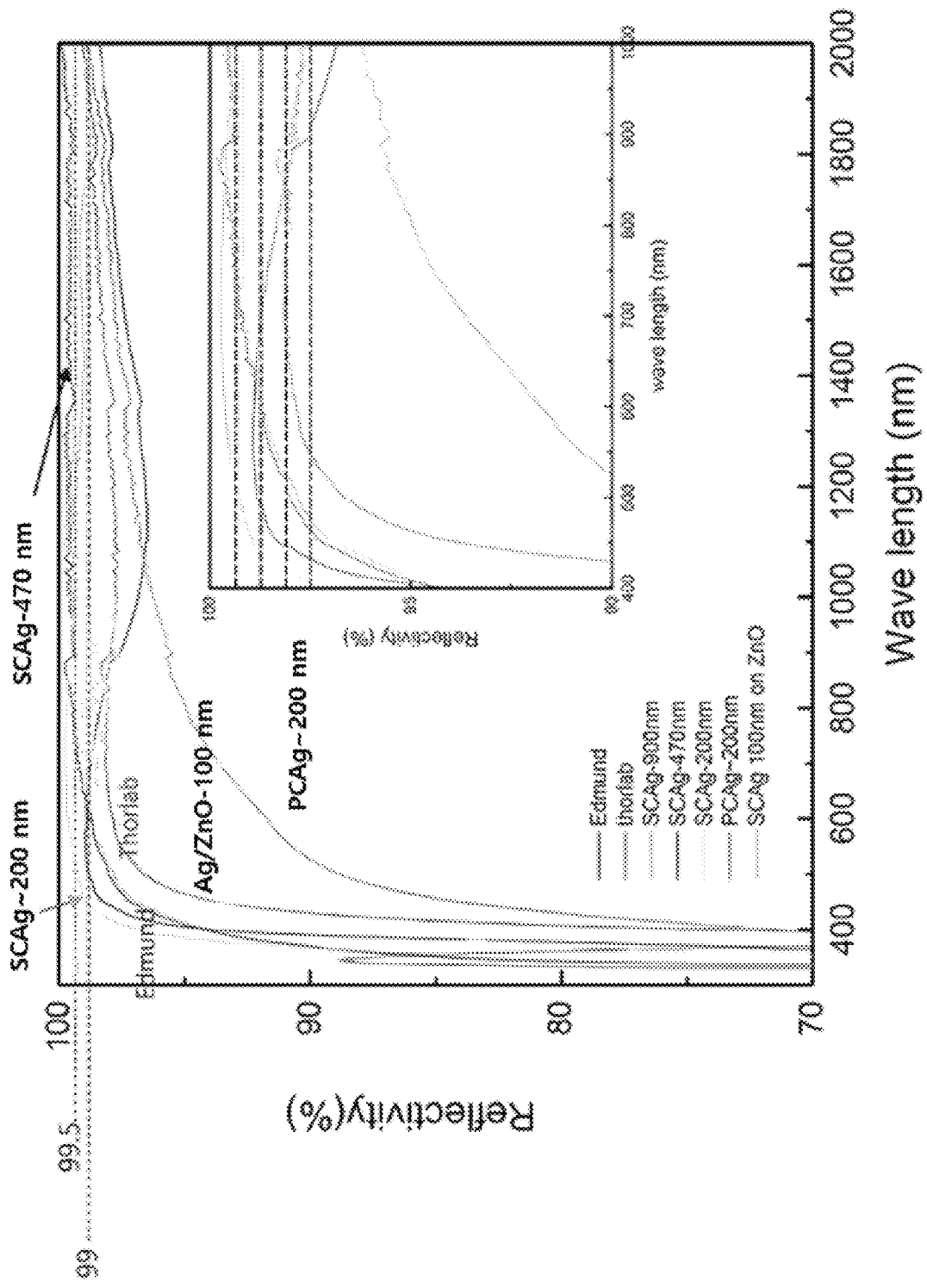
FIG. 16 is a graph showing reflectivity comparison of the single-crystal silver thin film structure according to the embodiment of the present invention.

FIG. 16 is a graph showing reflectivity comparison of the single-crystal silver thin film structure according to the embodiment of the present invention. The specific specifications of Edmund, Thorlab, SCAg-200 nm, SCAg-470 nm, SCAg-900 nm, PCAg-200 nm, SCAg 100 nm on ZnO, as shown in FIG. 16 are listed in Table 1 below.

TABLE 1

| | Specification |
|---|---|
| Edmund | Sample of Optical component manufacturing company |
| Thorlab | Sample of Optical component manufacturing company |
| SCAg-200 nm | 200 nm thick single-crystal silver thin film layer (30) of the present invention |
| SCAg-470 nm | 470 nm thick single-crystal silver thin film layer (30) of the present invention |
| SCAg-900 nm | 900 nm thick single-crystal silver thin film layer (30) of the present invention |
| PCAg-200 nm | 200 nm thick poly crystal silver thin film layer |
| SCAg 100 nm on ZnO | 100 nm thick single-crystal silver thin film layer (30) deposited on ZnO buffer layer |

As appreciated from FIG. 16, the single-crystal silver thin film structure according to the embodiment of the present invention is rarely reduced in reflectivity even though the thickness of the single-crystal silver thin film layer 30 increases from 200 nm to 900 nm, so that the reflectivity is greater than or equal to about 99%, which is more improved than that of the samples of Edmund and Thorlab on sale in the market. However, if not the single-crystal silver thin film layer 30 but a poly crystal silver thin film layer is deposited, it can be appreciated that the reflectivity is drastically reduced to a value less than 90% in the light wavelength of 500 nm. Further, if not the single-crystal copper thin-film buffer layer 20 but a ZnO buffer layer is deposited, it can be appreciated that the reflectivity is somewhat reduced to about 95% in the light wavelength of 500 nm. As mentioned above, the single-crystal silver thin film structure and the method for manufacturing the same according to the present invention are characterized by using the single-crystal copper thin film as the buffer layer so that the single-crystal silver thin film is grown to the large area with the wafer scale, while having high adhesion force with the substrate, thereby improving the electrical and optical properties thereof, enhancing the adhesion with the substrate, and making it possible to be applied to real products. In specific, the reflectivity in the wavelength range of 400 to 2000 nm is greater than or equal to 98%, and accordingly, the single-crystal silver thin film structure is very useful as an optical mirror.

It is to be understood that the disclosed embodiments are merely exemplary of the invention, which can be embodied in various forms. Those skilled in the art will envision many other possible variations within the scope of the present invention.

The present invention may be modified in various ways and may have several exemplary embodiments. However, this does not limit the invention within specific embodiments and it should be understood that the invention covers all the modifications, equivalents, and replacements within the idea and technical scope of the invention.

EXPLANATIONS OF REFERENCE NUMERALS

10: Transparent substrate
20: Single-crystal copper thin-film buffer layer
30: Single-crystal silver thin film layer
S100: Step of forming a single-crystal copper thin-film buffer layer
S200: Step of forming a single-crystal silver thin film layer

The invention claimed is:

1. A single-crystal silver thin film structure comprising:
a transparent substrate;
a single-crystal copper thin-film buffer layer depositedly formed on top of the transparent substrate; and
a single-crystal silver thin film layer depositedly formed on the single-crystal copper thin-film buffer layer,
wherein the single-crystal silver thin film structure is characterized by using the single-crystal copper thin-film buffer layer.

2. The single-crystal silver thin film structure according to claim 1, wherein the transparent substrate is a single-crystal sapphire substrate.

3. The single-crystal silver thin film structure according to claim 1, wherein the single-crystal copper thin-film buffer layer and the single-crystal silver thin film layer have the same crystal axis as each other, independently of each other.

4. The single-crystal silver thin film structure according to claim 3, wherein the single-crystal copper thin-film buffer layer and the single-crystal silver thin film layer are grown by the same distance as each other along a, b, and c axes if the crystal axes are represented as the a axis, b axis, and c axis wherein, the a, b, and c axes are perpendicular to one another.

5. The single-crystal silver thin film structure according to claim 1, having the reflectivity represented by the following Expression 1 greater than or equal to 98%, Reflectivity=((Intensity of Reflected light wavelength)/(Intensity of Incident light wavelength))×100    [Expression 1]

wherein, wavelengths of the reflected light and the incident light are in the range of 400 to 2000 nm.

6. A method for manufacturing a single-crystal silver thin film structure, comprising:
the step of forming a single-crystal copper thin-film buffer layer by applying a plasma to a single-crystal copper ingot target to deposit the single-crystal copper thin-film buffer layer on a transparent substrate; and the step of forming a single-crystal silver thin-film layer by applying plasma to a single-crystal silver ingot target to deposit the single-crystal silver thin film layer on the single-crystal copper thin-film buffer layer, wherein the method for manufacturing the single-crystal silver thin film structure is characterized by using the single-crystal copper thin-film buffer layer.

7. The method according to claim 6, wherein the step of the forming the single-crystal copper thin-film buffer layer is carried out by depositing the single-crystal copper thin-film buffer layer on the transparent substrate by means of sputtering.

8. The method according to claim 7, wherein the sputtering is carried out at power of 20 to 40 W and at temperature of 150 to 250° C.

9. The method according to claim 6, wherein the step of forming the single-crystal silver thin-film layer is carried out by depositing the single-crystal silver thin film layer on the single-crystal copper thin-film buffer layer by means of sputtering.

10. The method according to claim 9, wherein the sputtering is carried out at power of 5 to 20 W and at temperature of 100 to 250° C.

\* \* \* \* \*